(12) United States Patent
Huber et al.

(10) Patent No.: US 7,002,372 B2
(45) Date of Patent: Feb. 21, 2006

(54) MODERATE CURRENT 5V TOLERANT BUFFER USING A 2.5 VOLT POWER SUPPLY

(75) Inventors: Carol Ann Huber, Macungie, PA (US); Bernard Lee Morris, Emmaus, PA (US); Makeshwar Kothandaraman, Karnataka (IN); Yehuda Smooha, Allentown, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/759,162

(22) Filed: Jan. 20, 2004

(65) Prior Publication Data

US 2005/0156628 A1 Jul. 21, 2005

(51) Int. Cl.
*H03K 19/0175* (2006.01)
(52) U.S. Cl. ............................. 326/81; 326/80; 326/86
(58) Field of Classification Search .................. 326/80, 326/81, 82, 83, 86
See application file for complete search history.

(56) References Cited

U.S. PATENT DOCUMENTS

| 6,236,236 B1 * | 5/2001 | Chen ........................... 326/81 |
| 6,693,469 B1 * | 2/2004 | Prodanov ..................... 327/108 |
| 6,724,226 B1 * | 4/2004 | Kim ............................ 327/108 |

* cited by examiner

Primary Examiner—Daniel D. Chang (57) ABSTRACT

A low voltage, 5V tolerant open drain output buffer having moderate current tolerance capabilities is formed with 3.3V technology using a nominal power supply of 2.5V or less. The buffer includes an inverter, a series connection of the current paths of three n-channel FET transistors, and a backgate bias generator. One terminal of the series connection of three transistors is connected to a PAD, and the other terminal of the lower transistor of the series is connected to ground. The bias generator is formed using two p-channel field effect transistors (FETs) that are cross-connected between VDD and the PAD. A gate of a central one of the three transistors is connected to the power supply. An output of the bias generator is connected to a gate of the upper transistor. The inventive buffer may be manufactured using standard 3.3V processes, but functions with a power supply of, e.g., 2.5V or 1.8V.

26 Claims, 7 Drawing Sheets

IMPROVED 5V TOLERANT OPEN DRAIN OUTPUT BUFFER

FIG. 1

COMPACTOR TO GENERATE NORM SIGNAL

IMPROVED 5V TOLERANT OPEN DRAIN OUTPUT BUFFER

FIG. 6

IMPROVED 5V TOLERANT OPEN DRAIN BI-DIRECTIONAL BUFFER

FIG. 7
(PRIOR ART)

5V TOLERANT OPEN DRAIN OUTPUT BUFFER

MODERATE CURRENT 5V TOLERANT BUFFER USING A 2.5 VOLT POWER SUPPLY

BACKGROUND OF THE INVENTION

1. Field of the Invention

This invention relates generally to buffers. More particularly, it relates to integrated circuits (ICs) including low voltage buffers, e.g., 2.5 volt buffers having high current and/or voltage tolerance.

2. Background of Related Art

In computer systems, the reduction of power usage is paramount. Initially, many computer buses (e.g., SCSI, DDR, PCI, PCMCIA, etc.) were based on 5 volt standards. More recently, the voltage level of those standards has been lowered to 3.3 volts. The lower voltage provides significant power savings, lowers capacitance between lines, and other advantages.

However, in lowering the voltage standard to 3.3V, many existing system components would have been rendered useless but for requirements that the new, lower voltage systems be backwards compatible to accommodate 5V components. Thus, system components generally powered at only 3.3V needed to communicate with system components that were powered at 5V. The terminology referring to this backwards compatibility for 5V legacy systems is commonly referred to as "5V tolerant" systems.

Various system components communicate with one another typically via wired lines or busses. To buffer various components, input and/or output buffers are typically established at the input or output of any line in communication with the bus or lines to another system component. Many systems have bi-directional communication lines, and bi-directional buffers are appropriately used. 5V tolerant, 3.3V buffers have been known. For instance, FIG. 7 shows a portion of an integrated circuit including conventional 5V tolerant open drain buffer made with 3.3V technology MOS transistors.

Figure 7:
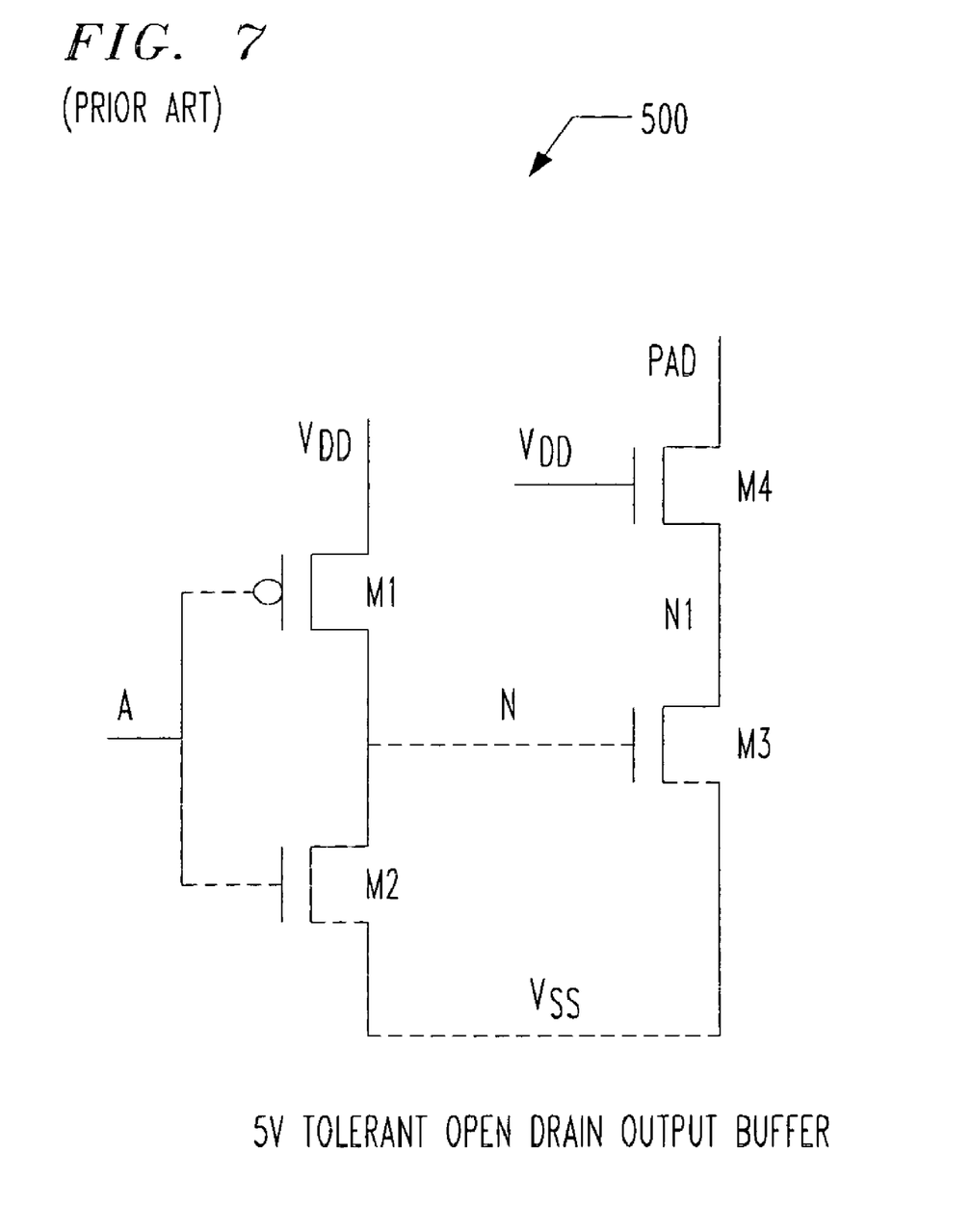
FIG. 7 shows an integrated circuit including a conventional 5V tolerant open drain buffer made with 3.3V technology MOS transistors.

In particular, as shown in FIG. 7, VDD represents the power supply, and VSS ground. An inverter formed by a series connection of a p-channel Field Effect Transistor (FET) M1 and an n-channel FET transistor M2 drives node N to the opposite voltage of the input signal A. An output stage comprises a series connection of two n-channel FET transistors M3 and M4. The gate of transistor M3 is connected to node N, while the gate of transistor M4 is connected to the power supply VDD.

In operation, when signal A is LOW, node N goes HIGH, turning transistor M3 ON and pulling PAD LOW, since transistor M4 is always ON. When signal A is HIGH, node N is driven LOW, turning transistor M3 OFF.

If a 5V signal is applied to PAD when signal A is HIGH, transistor M4 protects transistor M3 by acting as a source-follower. Thus, when PAD is at 5V, transistor M4 does not allow node N1 to go below VDD-Vtn, where Vtn is the n-channel threshold of transistor M4. This value is typically 0.8V. With a nominally 3.3V+/−10% power supply (VDD=3.3V), the voltage at node N1 cannot go below 3.0V−0.8V=2.2V. On the other hand, with a maximum voltage of 5V+10%=5.5V on PAD (high end range of a nominally 5.0V power supply), this limits the drain-to-source voltage on transistor M4 to 5.5V−2.2V=3.3V.

In the never-ending quest to lower power consumption and increase the speed of electronic and computer systems, lower voltage standards are being developed, most notably a 2.5V standard. Over the years this standard may drop to 2.0V, and even to 1.8V. For such low voltage systems to maintain support for and compatibility with legacy systems, it is desirable for 2.5V systems to be capable of communicating and fully operable with systems using nominal 5V and 3.3V power supplies. However, significant hurdles exist for such ultra low voltage 2.5V (and less) systems to be tolerant to 5V inputs or outputs.

For instance, while power supplies have a nominal voltage of, e.g., 5V or 2.5V, etc., power supplies typically exhibit a tolerance in voltage variation of +/−10%. Tight tolerances on a power supply dramatically increases costs of the power supply. As in everything, there is a balance between acceptable tolerance and price. Many power supplies are considered acceptable with a +/−10% tolerance. Thus, even though a power supply might be nominally rated for 2.5V, it can be as low as 2.25V. Similarly, even though a 5.0V system is nominally rated for 5.0V, it can be as high as 5.5V.

Referring again to the conventional buffer 500 shown in FIG. 7, if VDD were to be lowered to only 2.25V, then node N1 can go as low as 2.25V−0.8V=1.45V. This generates a drain-to-source voltage on transistor M4 equal to 5.5V−1.45V=4.05V. This voltage of over 4 volts significantly exceeds the high end technology limit of 3.63V for 3.3V technology. Thus, the transistors of the buffer 500 would be damaged if VDD were an in-spec 2.25V and an in-spec 5.5V legacy system were connected to the buffer 500.

Current 5V tolerant buffers manufactured using 3.3V technology require a 3.3V power supply to assure that no transistor sees a gate voltage or drain-to-source voltage greater than 3.63V. There is a need for an integrated circuit having a 5V tolerant buffer design that can be powered with a power supply voltage significantly lower than 3.3 V, e.g., of only a 2.5V (or lower voltage).

BRIEF DESCRIPTION OF THE DRAWINGS

Features and advantages of the present invention will become apparent to those skilled in the art from the following description with reference to the drawings, in which.

SUMMARY OF THE INVENTION

In accordance with the principles of the present invention, a low voltage, 5V tolerant buffer comprises an inverter, and a current path-series connection of at least three transistors. An end of an upper transistor in the current path-series connection is connected to a PAD, and an end of a lower transistor of the series connection is connected to ground. A bias generator has an output connected to a gate of the upper transistor. A gate of a central one of the current path series connection of three transistors is connected to a power supply of no greater than 2.5V nominal. Typically the buffer is manufactured as part of an IC, though it could alternatively be manufactured as separate components.

In accordance with another aspect of the invention, a method of providing a low voltage, 5V tolerant buffer comprises adapting an input signal for inversion. A current path-series connection of at least three transistors is provided. A terminal of an upper transistor in the current path-series connection is connected to a PAD. A terminal of a lower transistor of the current path-series connection is connected to ground. A bias voltage is provided to a gate of the upper transistor. The bias voltage is based on a difference between a power supply voltage and a voltage at the PAD. A power supply input is coupled to a gate of a central one of the current path-series connection of three transistors.

DETAILED DESCRIPTION OF ILLUSTRATIVE EMBODIMENTS

The embodiments of the present invention are designed for use with a power supply of a 2.5V nominal power supply. Nominal as used herein relates to the acknowledgement that actual power varies within a reasonable tolerance, e.g., most often +/10%. Thus, a nominal 2.5V power supply may actually produce anywhere between 2.25V and 2.75V. The disclosed embodiments are equally applicable for operation with voltage supplies as low as 2.0V nominal, and possibly as low as 1.8V nominal.

Some buffers are required to tolerate an input voltage greater than that allowed by the particular semiconductor technology. For instance, circuits that allow a 3.3V technology to tolerate a 5V signal applied to the buffer's pad have long been known. However, such circuits require a power supply of 3.3V to tolerate the 5V signal. The circuitry and methods described herein provide similar high voltage/current tolerance to be achieved with only a 2.5V power supply.

In a first embodiment, the buffer is determined to be area efficient for sink currents greater than about 30–40 mA. In a second embodiment, the buffer is determined to be area efficient for sink currents less than about 24 mA.

In all disclosed embodiments, the buffer (input, output, or bidirectional buffer) is an open drain buffer. It will be understood by those of ordinary skill in the art that the circuit described herein to provide an improved open drain buffer can also be used in the pull-down portion of a push-pull buffer.

Figure 1:
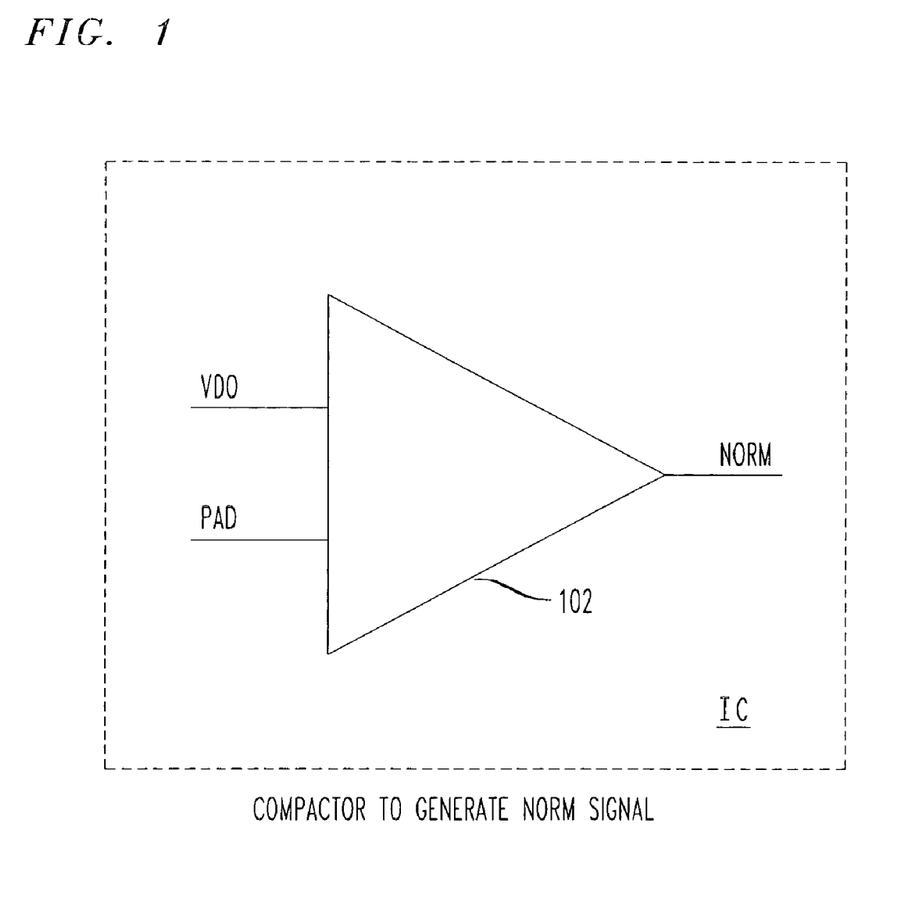
FIGS. 1 and 2 show a portion of an integrated circuit including a high current, 5V tolerant 2.5V (or lower voltage) open drain output buffer, in accordance with a first embodiment of the present invention.
Figure 2:
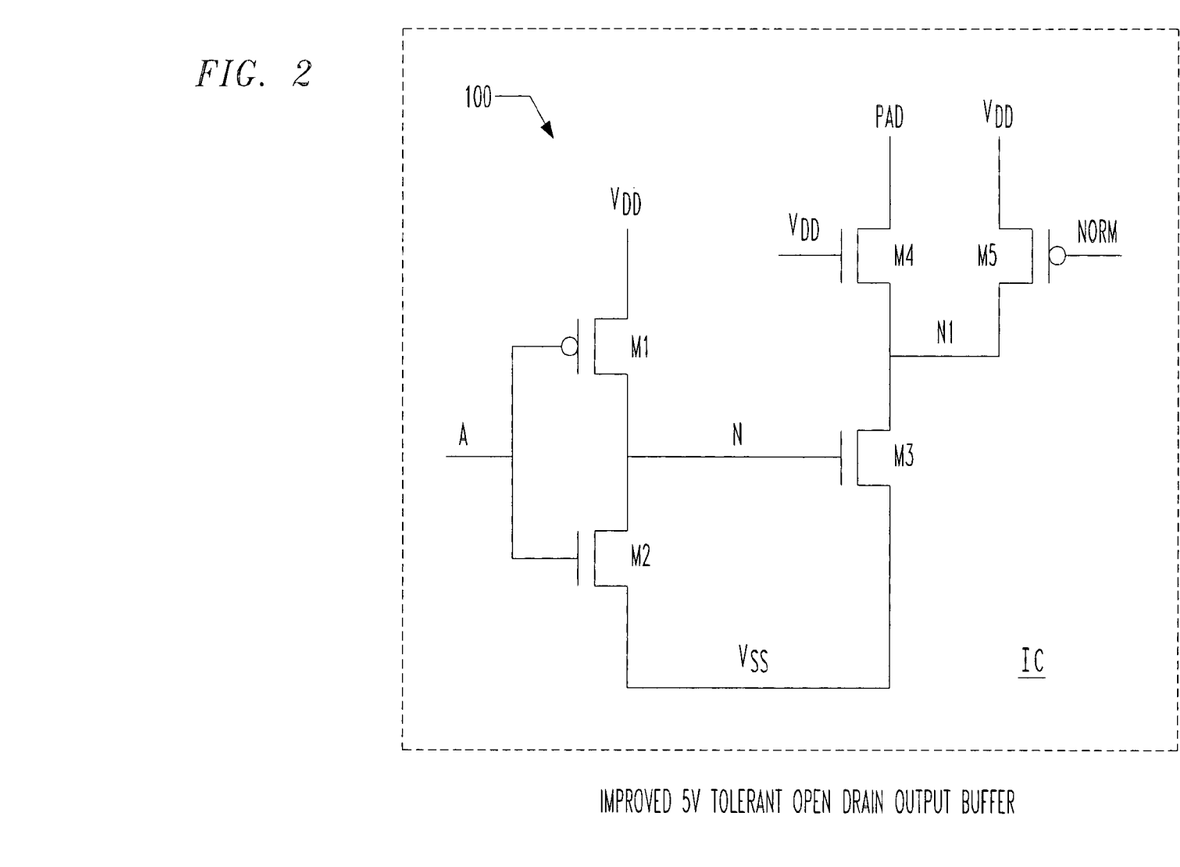

FIGS. 1 and 2 show a portion of an integrated circuit including a 5V tolerant 2.5V (or lower voltage) open drain output buffer, in accordance with a first embodiment of the present invention.

In particular, as shown in FIG. 1, a comparator 102 is used to generate an indicator signal NORM as to whether the signal on a particular signal line input is at the same voltage level as the buffer, or is higher (e.g., 5V) and thus requiring legacy backwards compatibility in the buffer. The comparator 102 has the power supply VDD of the buffer input into its non-inverting input (+), and a voltage level of the relevant input at the inverting input (−). The comparator 102 evaluates the difference in voltages between the power supply voltage VDD, and the voltage level of the relevant PAD. If VDD is greater than or essentially equal to PAD, then the legacy present signal NORM is driven HIGH by the comparator 102. On the other hand, if VDD is less than PAD, as is the case when 5V is applied to the PAD, then the legacy present signal NORM is driven LOW. It will be appreciated by those of ordinary skill in the art that the opposite signal levels may alternatively be implemented, i.e., with the legacy present signal NORM being driven HIGH if PAD is greater than VDD.

Appropriate hysteresis may be implemented in the comparator 102 to avoid oscillation when the PAD voltage is essentially the same as VDD.

FIG. 2 shows how the legacy present signal NORM may be utilized to instigate 5V tolerance in the output buffer 100, which uses a nominal power supply of VDD=2.5V in the disclosed embodiments.

In particular, as shown in FIG. 2, a p-channel FET transistor M5 has its current path connected between a power supply voltage VDD and a node N1. The node N1 is connected to a node between two series coupled output FET transistors M3 and M4. The current path of transistor M4 is connected between the PAD and node N1, and the current path of transistor M3 is connected between the node N1 and VSS, which is typically at ground potential.

The gate of the second transistor M3 is driven from a node N, formed between the series current path of a p-channel FET transistor M1 and an n-channel FET transistor M2. The other side of the current path of transistor M1 is connected VDD, which is typically at power supply potential, and the other side of the current path of transistor M2 is connected to VSS. The gates of the transistors M1, M2 are tied together forming node A, and are driven by a signal applied thereto.

In operation, when a 5V signal is applied to PAD, indicating that a legacy device is present and connected to the buffer 100, the legacy present signal NORM is driven low, turning transistor M5 ON. This connects node N1 to the power supply VDD electrically, and ensures that the minimum voltage at node N1 is VDD. Thus, the drain-to-source voltage on transistor M4 becomes limited to a maximum value of 5.5V−2.25V=3.25V. On the other hand, when PAD is less than (or essentially equal to) the 2.5V power supply VDD, the legacy present signal NORM is driven HIGH, turning transistor M5 OFF.

However, transistors M3 and M4, no matter how large, are not sufficient to protect the buffer 100, particularly from the damaging effects of an electro-static discharge (ESD) event. Transistors provided for ESD protection are large transistors, which are typically made from many smaller transistors connected in parallel, must have node N1 wired in common for the circuit of FIG. 2 to operate. However, this allows an ESD event to go through a single one of the small transistors, which can result in damage to that transistor. Therefore, in addition to transistors M3 and M4, another group of current path-series connected transistors whose mid-point is not wired out to any node, should be added. The width of the channels of each of these ESD protection transistors is typically 400–500 micrometers (uM). Therefore, it may not be area efficient to use the buffer 100 shown in FIG. 2 unless the current sinking requirement of the buffer makes it so large that the use of two series connected transistors is a real area savings over that required by three series connected transistors.

This is the case for many current applications, e.g., a SCSI application requiring, e.g., 48 mA sink current.

Figure 3:
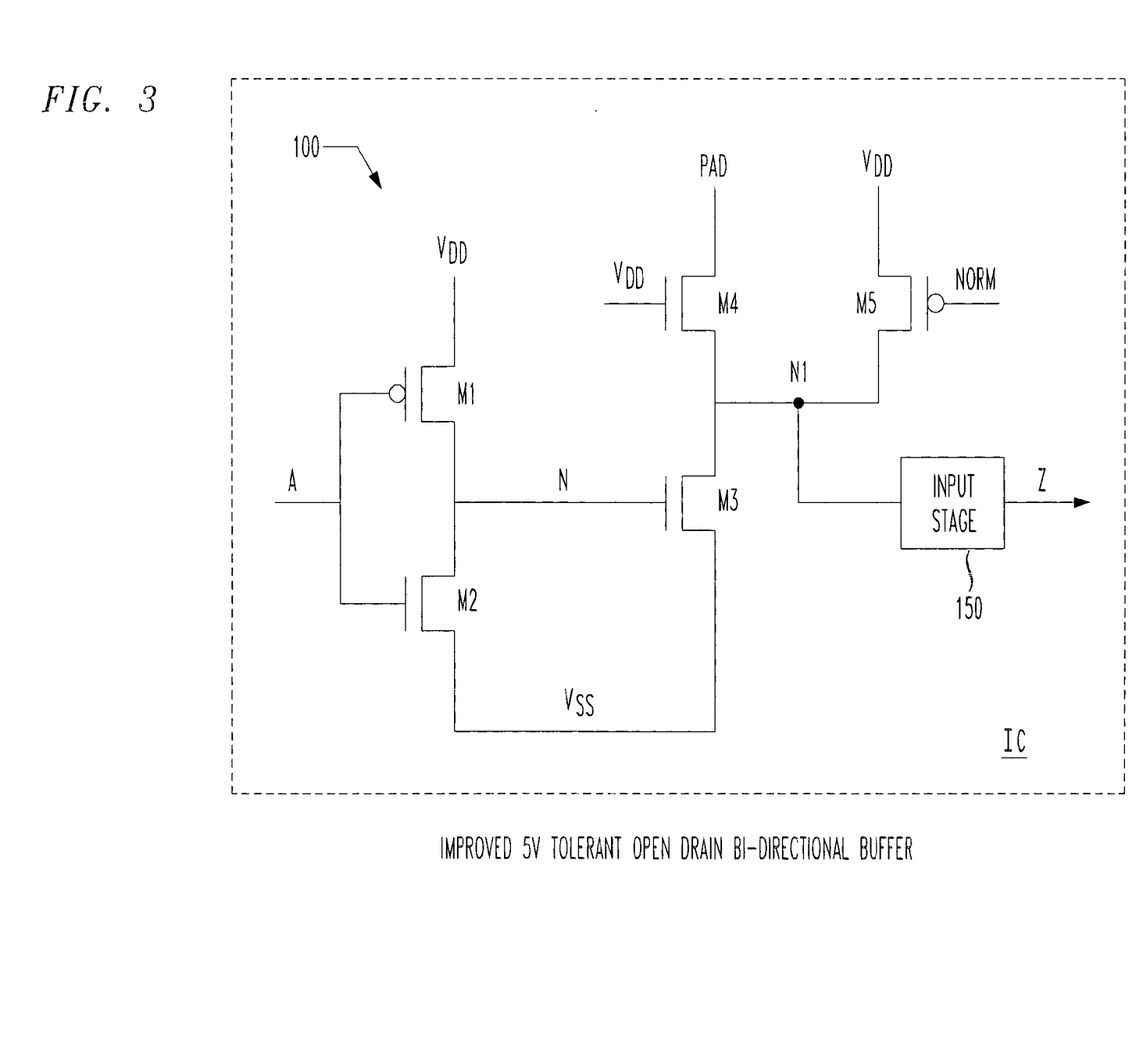
FIG. 3 shows the embodiment of FIGS. 1 and 2 implemented as an open drain bi-directional buffer.

FIG. 3 shows the embodiment of FIGS. 1 and 2 implemented as an open drain bidirectional buffer.

In particular, as shown in FIG. 3, an input stage 150 may be added to receive the signal input at the PAD via transistor M4. The input stage 150 provides an output signal Z to the other portions of the integrated circuit on which the buffer is fabricated.

The buffer 100 shown in FIGS. 1–3 allows 5V tolerance to be achieved in the commercial market, e.g., with an AL13 process such as is used by MAXTOR™, and with similar 3.3V processes, when the operating power supply is nominally only 2.5V or even less, e.g., 2.0V. It is area efficient for sink currents over about 30–40 mA.

In the case of more moderate requirements, another embodiment of the present invention is disclosed wherein an open drain buffer capable of 16 mA, is 5V tolerant in a 3.3V process technology, and is operated with only a nominal power supply of only 2.5V.

Figure 4:
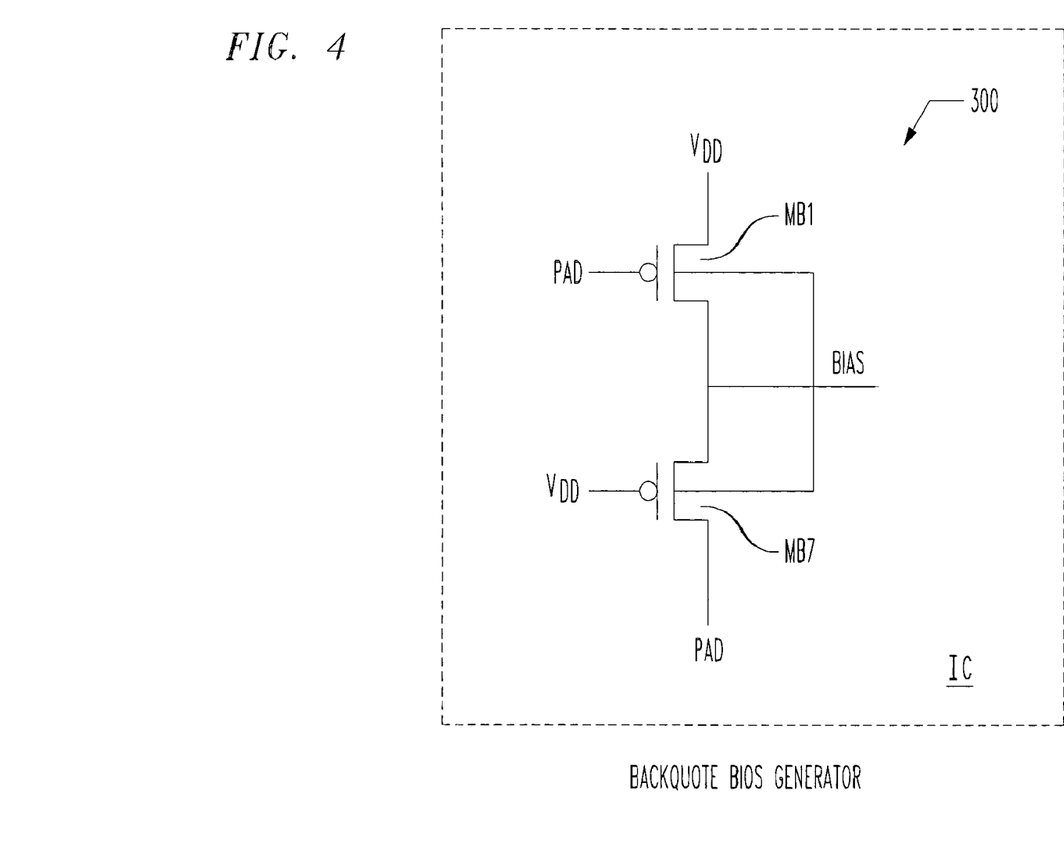
FIG. 4 shows a backgate bias generator formed on an integrated circuit.
Figure 5:
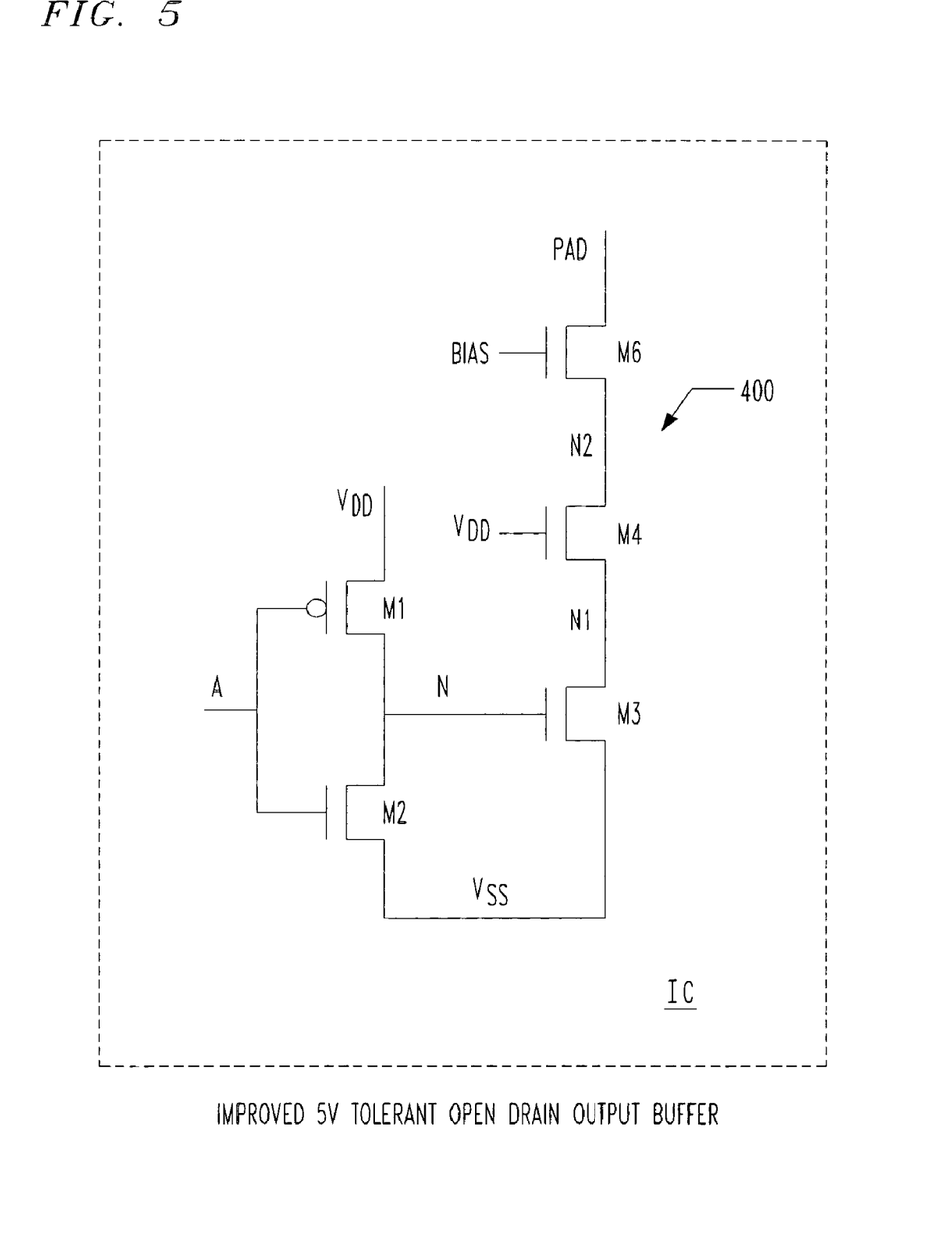
FIG. 5 shows an example of a more moderate current, 5V tolerant 2.5V (or lower voltage) open drain output buffer utilizing the backgate bias generator, in accordance with another embodiment of the present invention.

FIG. 4 shows a backgate bias generator, and FIG. 5 shows an example of a more moderate current, 5V tolerant 2.5V (or lower voltage) open drain output buffer utilizing the backgate bias generator, in accordance with another embodiment of the present invention.

In particular, FIG. 4 shows, as a part of an integrated circuit, a backgate bias generator 300 that uses two p-channel FET transistors MB1, MB2 with series connected current paths between VDD and the PAD. The backgate of both transistors MB1, MB2 is connected to node BIAS to ensure that the parasitic diodes associated with p-channel devices are always reverse biased.

The gates are cross-connected with the gate of transistor MB1 being coupled to the PAD, and the gate of transistor MB2 being coupled to VDD. When the PAD voltage is lower than VDD, transistor MB1 is turned ON and MB2 is turned OFF. Under this condition, node BIAS is equal to VDD.

When the PAD voltage is greater than VDD, MB1 is turned OFF and MB2 is turned ON. This connects node BIAS to the PAD.

FIG. 5 shows an exemplary 5V tolerant open drain output buffer utilizing the backgate bias generator 300 shown in FIG. 4, in accordance with another embodiment of the present invention.

In particular, the bias generator 300 of FIG. 4 is used to make the buffer 400 shown in FIG. 5 5V tolerant with a power supply VDD that is nominally only 2.5V (or even less, to about 2.0V).

The buffer 400 (e.g., output buffer) utilizes the same design for FET transistors M1, M2, M3 and M4 as shown and described with respect to FIGS. 1 and 2. However, the p-channel transistor M5 shown in FIG. 2 is not used, but instead an n-channel FET transistor M6 is added to the top of the series current path connection of transistors M4 and M3, such that there is a series current path connection of transistors M6, M4 and M3. The other side of the current path of transistor M6 is connected to the PAD, while the gate of transistor M6 is connected to the BIAS signal generated by the backgate bias generator 300 shown in FIG. 4.

The circuit of FIGS. 4 and 5 operates as follows. When signal A is LOW, node N is driven HIGH, transistors M3, M4 and M6 are turned ON, and the PAD is pulled LOW.

On the other hand, when signal A is HIGH, node N is driven LOW and transistor M3 is turned OFF. At that point, if a 5V level from a legacy system connected to the buffer 400 is applied to PAD, the BIAS signal will also be at 5V. Under these conditions, node N2 will be at a threshold voltage below the voltage level of PAD. For instance, the maximum voltage of node N2, considering an upper range of a nominal 5.0V source to be 5.5V (5.0V×10%=5.5V), and thus a 5.5V PAD signal, would be 5.5V−0.8V=4.7V.

At the low end of the nominal power supply voltage scale of 10% down from its nominal rating of 2.5V, or VDD=2.25V, then the minimum voltage at the node N1 will be 2.25V−0.8V=1.45V. In this scenario, the drain-to-source voltage across transistor M6 is 0.8V, and across transistor M4 is 3.25V.

Figure 6:
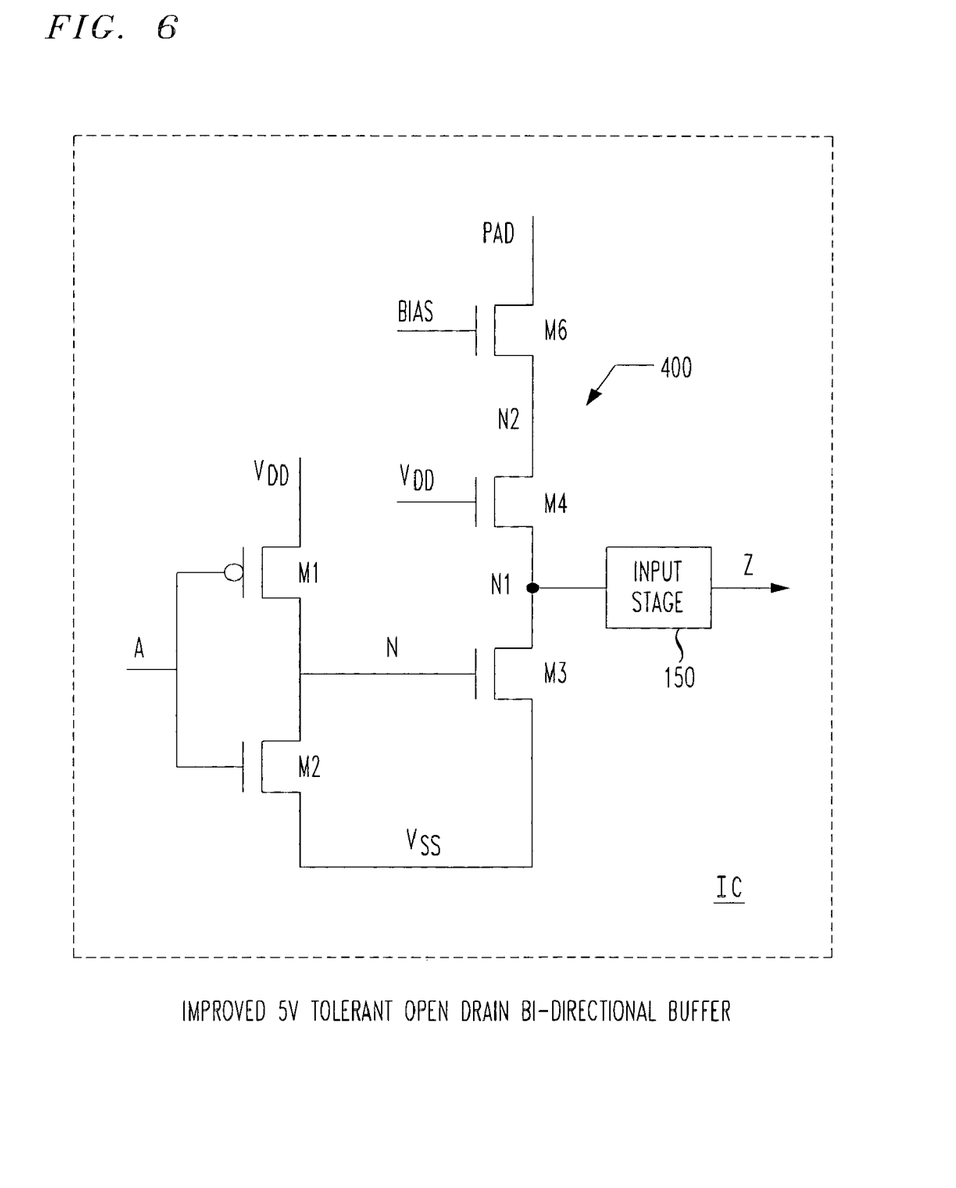
FIG. 6 shows an integrated circuit including the embodiment of FIGS. 4 and 5 implemented as an open drain bi-directional buffer.

FIG. 6 shows the embodiment of FIGS. 4 and 5 implemented as an open drain bidirectional buffer.

In particular, as shown in FIG. 6, an input stage 150 may be added to receive the signal input at the PAD via transistor M4. The input stage 150 provides an output signal Z to the other portions of the integrated circuit on which the buffer is fabricated.

The use of three series n-channel FET transistors M3, M4, M6 as shown in the exemplary embodiment of FIGS. 4–6 requires that each transistor be 50% larger than would be the case for a buffer with only two transistors in series. However, for ESD reasons, the minimum recommended size of the width of the channels of each of these transistors is 400–500 μm. The length of the channels of each of the FET transistors is typically dictated by the minimum channel length permitted by the relevant technology. The desired channel width for each of the three series transistors M3, M4, M6 to sink 16 mA is 450 μm, to minimize or eliminate altogether circuit area waste.

The embodiment of FIGS. 4–6 of the present invention allows 5V tolerance to be achieved with 3.3V processes, when the power supply is nominally only 2.5V, or even less, e.g., only 1.8V. This embodiment is area efficient for sink currents below about 24 mA.

While the invention has been described with reference to the exemplary embodiments thereof, those skilled in the art will be able to make various modifications to the described embodiments of the invention without departing from the true spirit and scope of the invention.

What is claimed is:

1. A low voltage, 5V tolerant buffer, comprising:
    a series connection of at least three transistors, a terminal of an upper transistor in said series connection being connected to a PAD, and a terminal of a lower transistor of said series connection being connected to ground;
    a bias generator, an output of said bias generator being connected to a gate of said upper transistor; and
    an input stage driven by a node between said central transistor and said lower transistor;
    wherein a gate of a central one of said series connection of three transistors is adapted to be connected to a power supply of no greater than 2.5V nominal; and
    said buffer is a bi-directional buffer.

2. The low voltage, 5V tolerant buffer according to claim 1, wherein said bias generator comprises:
    a series connection of two p-channel field effect transistors;
    said series connection of said two transistors being connected between said power supply and said PAD.

3. The low voltage, 5V tolerant buffer according to claim 2, wherein:
    a gate of one of said two transistors is adapted to be coupled to said PAD, and a gate of the other of said two transistors is adapted to be driven by said power supply.

4. The low voltage, 5V tolerant buffer according to claim 1, wherein:
    said upper transistor, said lower transistor, and said central transistor are each an n-channel field effect transistor.

5. The low voltage, 5V tolerant buffer according to claim 1, wherein:
    said buffer can reliably sink no more than about 16 milliamps of current.

6. The low voltage, 5V tolerant buffer according to claim 1, wherein:
said buffer is comprised in a SCSI bus.

7. The low voltage, 5V tolerant buffer according to claim 1, wherein:
said buffer is comprised in a PCI bus.

8. The low voltage, 5V tolerant buffer according to claim 1, wherein:
said buffer is comprised in a PCMCIA bus.

9. The low voltage, 5V tolerant buffer according to claim 1, further comprising:
an integrated circuit including said 5V tolerant buffer.

10. The low voltage, 5V tolerant buffer according to claim 1, wherein:
a channel width of at least one of said at least three transistors is at least 400 um.

11. The low voltage, 5V tolerant buffer according to claim 1, wherein:
said series connection of at least three transistors is a series connection of a current path of each of said at least three transistors.

12. The low voltage, 5V tolerant buffer according to claim 1, wherein:
each of said at least three transistors are a field effect transistor.

13. A method of providing a low voltage, 5V tolerant buffer, comprising:
providing a series connection of at least three transistors;
connecting an end of an upper transistor in said series connection to a PAD;
connecting an end of a lower transistor of said series connection to ground;
providing a bias voltage to a gate of said upper transistor, said bias voltage being based on a difference between a power supply voltage and a voltage at said PAD;
providing a power supply input to a gate of a central one of said series connection of three transistors; and
providing an input stage adapted to be driven by a node between said central transistor and said lower transistor.

14. The method of providing a low voltage, 5V tolerant buffer according to claim 13, further comprising:
providing a power supply voltage of no greater than 2.5V nominal.

15. The method or providing a low voltage, 5V tolerant buffer according to claim 13, further comprising:
providing a power supply voltage of no greater than 2.0V nominal.

16. The method of providing a low voltage, 5V tolerant buffer according to claim 13, further comprising:
providing a power supply voltage of no greater than 1.8V nominal.

17. The method of providing a low voltage, 5V tolerant buffer according to claim 13, wherein:
said buffer is comprised in a SCSI bus.

18. Apparatus for providing a low voltage, 5V tolerant buffer, comprising:
means for inverting an input signal to a series connection of an upper transistor, a central transistor, and a lower transistor;
means for connecting a terminal of said upper transistor to a PAD;
means for connecting a terminal of said lower transistor to ground;
means for providing a bias voltage to a gate of said upper transistor, said bias voltage being based on a difference between a power supply voltage and a voltage at said PAD; and
means for coupling a power supply input to a gate of said central transistor; and
means for providing an input stage adapted to be driven by a node between a central transistor and said lower transistor;
wherein said buffer is a bi-directional buffer.

19. The apparatus for providing a low voltage, 5V tolerant buffer according to claim 18, further comprising:
means for providing said power supply voltage of no greater than 2.5V nominal.

20. The apparatus for providing a low voltage, 5V tolerant buffer according to claim 18, further comprising:
means for coupling said power supply voltage of no greater than 2.0V nominal.

21. The apparatus for providing a low voltage, 5V tolerant buffer according to claim 18, further comprising:
means for providing said power supply voltage of no greater than 1.8V nominal.

22. The apparatus for providing a low voltage, 5V tolerant buffer according to claim 18, wherein:
said buffer is comprised in a SCSI bus.

23. A low voltage, 5V tolerant buffer, comprising:
a series connection of at least three transistors, a terminal of an upper transistor in said series connection being connected to a PAD, and a terminal of a lower transistor of said series connection being connected to ground; and
a bias generator, an output of said bias generator being connected to a gate of said upper transistor;
wherein a gate of a central one of said series connection of three transistors is adapted to be connected to a power supply of no greater than 2.5V nominal; and
wherein said bias generator comprises a series connection of two transistors between said power supply and said PAD.

24. The low voltage, 5V tolerant buffer according to claim 23, wherein:
an upper transistor of said bias generator has a gate being connected to said PAD.

25. The low voltage, 5V tolerant buffer according to claim 24, wherein:
a lower transistor of said bias generator has a gate being connected to said power supply.

26. A low voltage, 5V tolerant buffer, comprising:
a series connection of at least three transistors, a terminal of an upper transistor in said series connection being connected to a PAD, and a terminal of a lower transistor of said series connection being connected to ground; and
a bias generator, an output of said bias generator being connected to a gate of said upper transistor, said bias generator comprising:
a series connection of two p-channel field effect transistors, a gate of one of said two transistors is adapted to be coupled to said PAD, and a gate of the other of said two transistors is adapted to be driven by said power supply, and
said series connection of said two transistors being connected between said power supply and said PAD;
wherein a gate of a central one of said series connection of three transistors is adapted to be connected to a power supply of no greater than 2.5V nominal.

* * * * *